United States Patent
Moschiano et al.

(10) Patent No.: US 10,482,974 B1
(45) Date of Patent: Nov. 19, 2019

(54) OPERATION OF A MEMORY DEVICE DURING PROGRAMMING

(71) Applicant: MICRON TECHNOLOGY, INC., Boise, ID (US)

(72) Inventors: Violante Moschiano, Avezzano (IT); Purval S. Sule, Folsom, CA (US); Han Liu, Sunnyvale, CA (US); Andrea D'Alessandro, L'Aquila (IT); Pranav Kalavade, San Jose, CA (US); Han Zhao, Santa Clara, CA (US); Shantanu Rajwade, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/106,185

(22) Filed: Aug. 21, 2018

(51) Int. Cl.
| | | |
|---|---|---|
| G11C 16/06 | (2006.01) | |
| G11C 16/12 | (2006.01) | |
| G11C 11/4074 | (2006.01) | |
| G11C 16/04 | (2006.01) | |
| G11C 16/34 | (2006.01) | |
| G11C 5/06 | (2006.01) | |

(52) U.S. Cl.
CPC ............ *G11C 16/12* (2013.01); *G11C 5/063* (2013.01); *G11C 11/4074* (2013.01); *G11C 16/0483* (2013.01); *G11C 16/3427* (2013.01)

(58) Field of Classification Search
CPC . G11C 16/12; G11C 16/0483; G11C 16/3427; G11C 5/063; G11C 11/4074
USPC ............ 365/185.25, 185.17, 185.18, 185.23, 365/185.24
See application file for complete search history.

(56) References Cited

U.S. PATENT DOCUMENTS

| 8,400,827 | B2 * | 3/2013 | Moschiano | ......... G11C 11/5628 365/185.03 |
| 8,542,531 | B2 * | 9/2013 | Franklin | ................. G11C 11/10 365/185.18 |
| 2014/0321215 | A1 | 10/2014 | Sakui | |
| 2016/0372201 | A1 | 12/2016 | Moschiano et al. | |

OTHER PUBLICATIONS

Liang, et al.; "Memory Architecture and Operation"; U.S. Appl. No. 15/569,854, filed Oct. 27, 2017; Total pp. 35.

* cited by examiner

*Primary Examiner* — Connie C Yoha
(74) *Attorney, Agent, or Firm* — Dicke, Billig & Czaja, PLLC

(57) ABSTRACT

Methods include applying a first voltage level to first and second data lines while applying a second, lower, voltage level to first and second select gates connected between the data lines and respective strings of memory cells; decreasing a voltage level of the first data line to a third voltage level; increasing a voltage level of the first select gate to a fourth voltage level; applying a fifth voltage level, higher than the first voltage level, to first and second access lines coupled to memory cells of the strings of memory cells; and increasing a voltage level of the first access line to a sixth voltage level.

20 Claims, 8 Drawing Sheets

OPERATION OF A MEMORY DEVICE DURING PROGRAMMING

TECHNICAL FIELD

The present disclosure relates generally to memory and, in particular, in one or more embodiments, the present disclosure relates to operation of a memory device during programming.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

Programming memory typically utilizes an iterative process of applying a programming pulse to a memory cell and verifying if that memory cell has reached its desired data state in response to that programming pulse, and repeating that iterative process until that memory cell passes the verification. Once a memory cell passes the verification, it may be inhibited from further programming, although other memory cells may still be enabled for programming for subsequent programming pulses. The iterative process can be repeated with changing (e.g., increasing) voltage levels of the programming pulse until each memory cell selected for the programming operation has reached its respective desired data state, or some failure is declared, e.g., reaching a maximum number of allowed programming pulses during the programming operation.

While programming a selected memory cell of one NAND string, a memory cell of an adjacent NAND string might be inhibited from programming. This typically involves boosting a voltage level of a channel region of the adjacent NAND string such that a programming voltage applied to its memory cell produces a voltage differential across its gate stack that is insufficient to appreciably change the threshold voltage of that memory cell. Where the boosting of the channel voltage is insufficient, unintended changes in the threshold voltage of the inhibited memory cell might occur. This is a condition known generally as program disturb.

To meet the demand for higher capacity memories, designers continue to strive for increasing memory density, i.e., the number of memory cells for a given area of an integrated circuit die. One way to increase memory density is to form NAND strings vertically along semiconductor pillars, which can act as channel regions of the NAND strings. However, such NAND string architecture may result in higher resistance levels for a channel region, thus making it more difficult to boost the voltage level of the channel region prior to applying a programming pulse.

DETAILED DESCRIPTION

Figure 1:
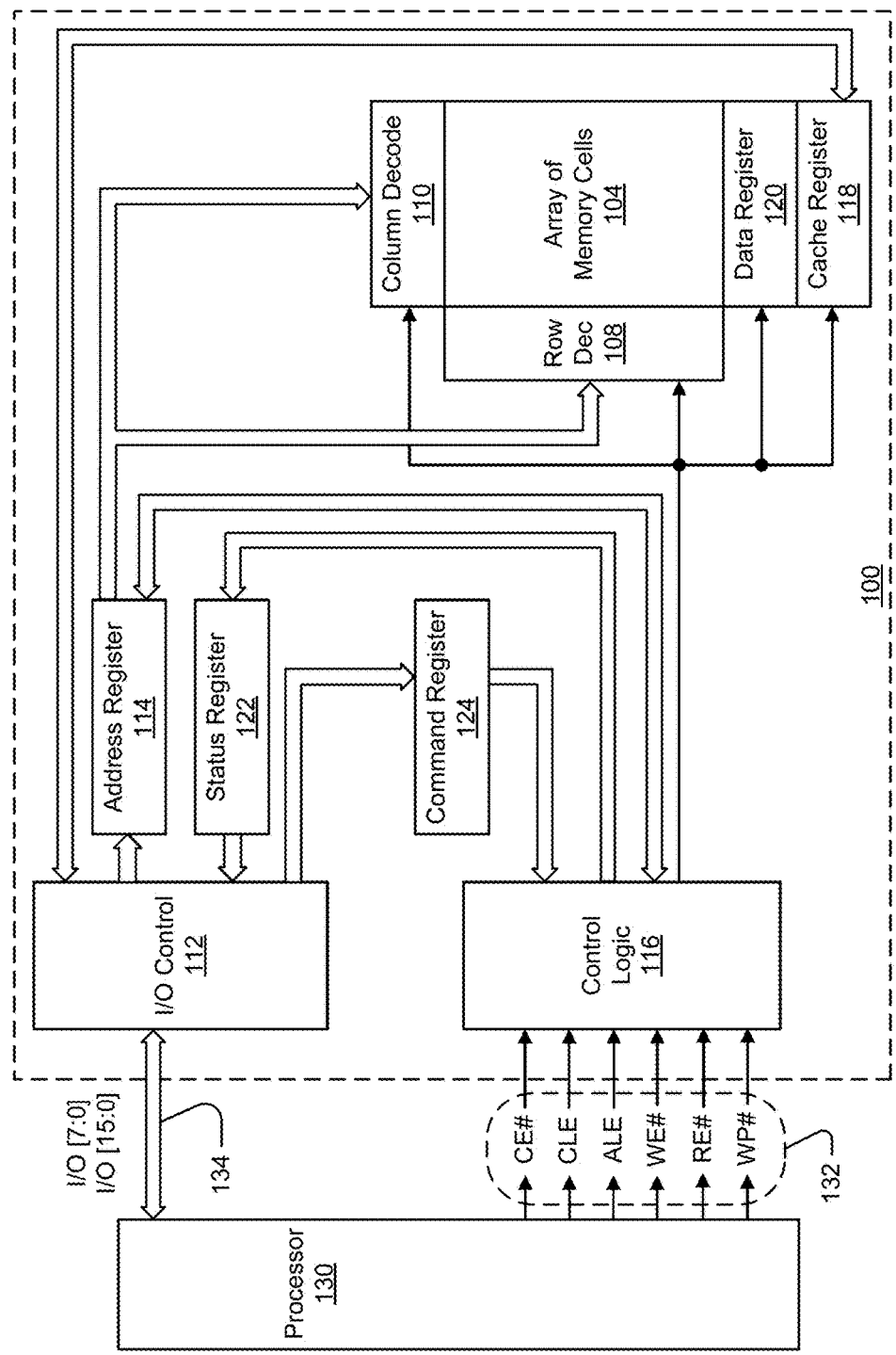
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., read operations, programming operations and/or erase operations) in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data may be passed from the cache register 118 to the data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. A status register 122 may be in communication with I/O control circuitry 112 and control logic 116 to latch the status information for output to the processor 130.

Memory device 100 receives control signals at control logic 116 from processor 130 over a control link 132. The control signals might include a chip enable CE#, a command latch enable CLE, an address latch enable ALE, a write enable WE#, a read enable RE#, and a write protect WP#. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands my be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) may be used in the various embodiments.

Figure 2A:
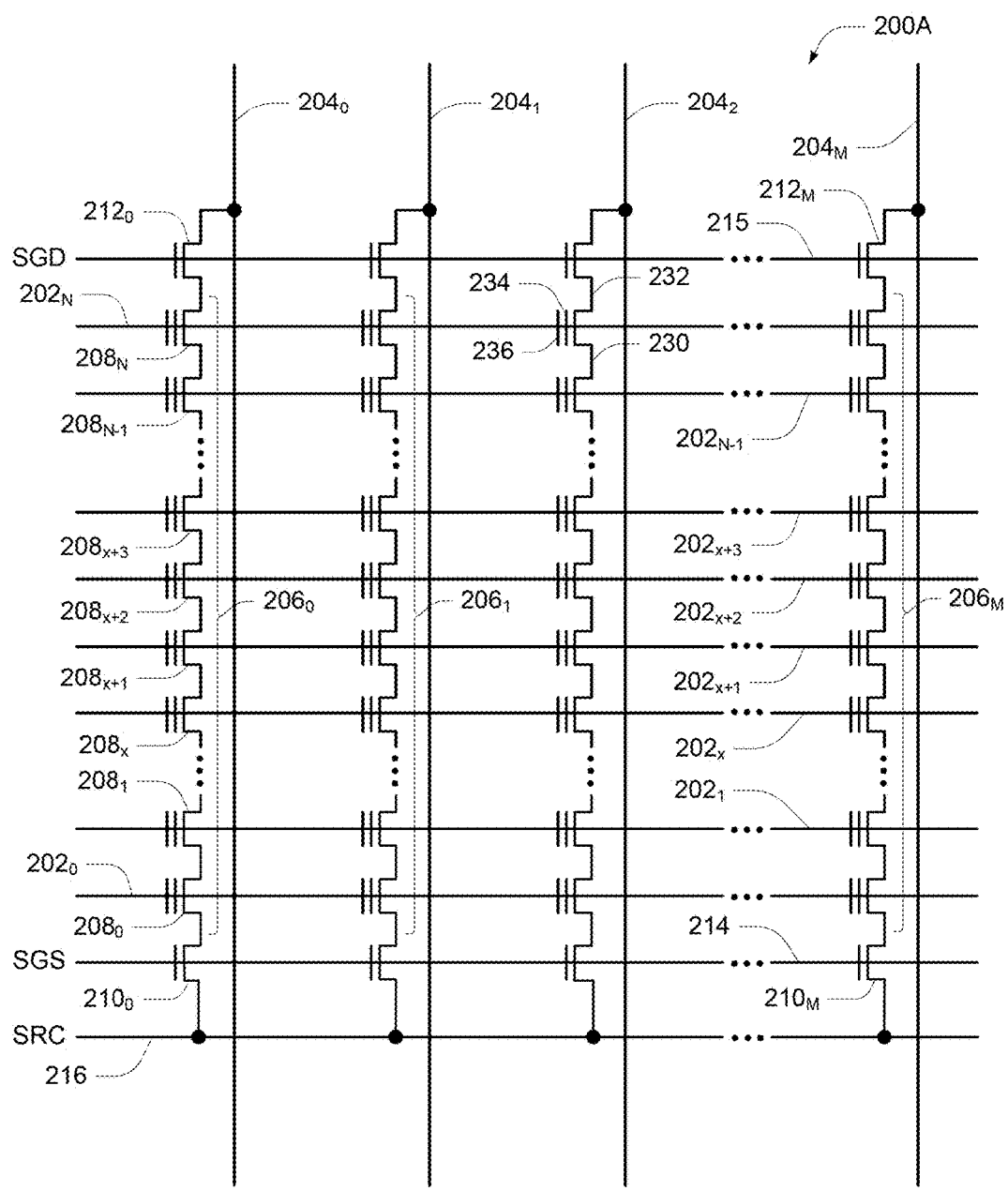
FIGS. 2A-2B are schematics of portions of an array of memory cells as could be used in a memory of the type described with reference to FIG. 1.

FIG. 2A is a schematic of a portion of an array of memory cells 200A as could be used in a memory of the type described with reference to FIG. 1, e.g., as a portion of array of memory cells 104. Memory array 200A includes access lines, such as word lines $202_0$ to $202_N$, and a data line, such as bit line 204. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source 216 (SRC) and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the common bit line 204. A control gate of each select gate 212 might be connected to select line 215.

The memory array in FIG. 2A might be a three-dimensional memory array, e.g., where NAND strings 206 may extend substantially perpendicular to a plane containing the common source 216 and to a plane containing a plurality of bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and/or dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Figure 2B:
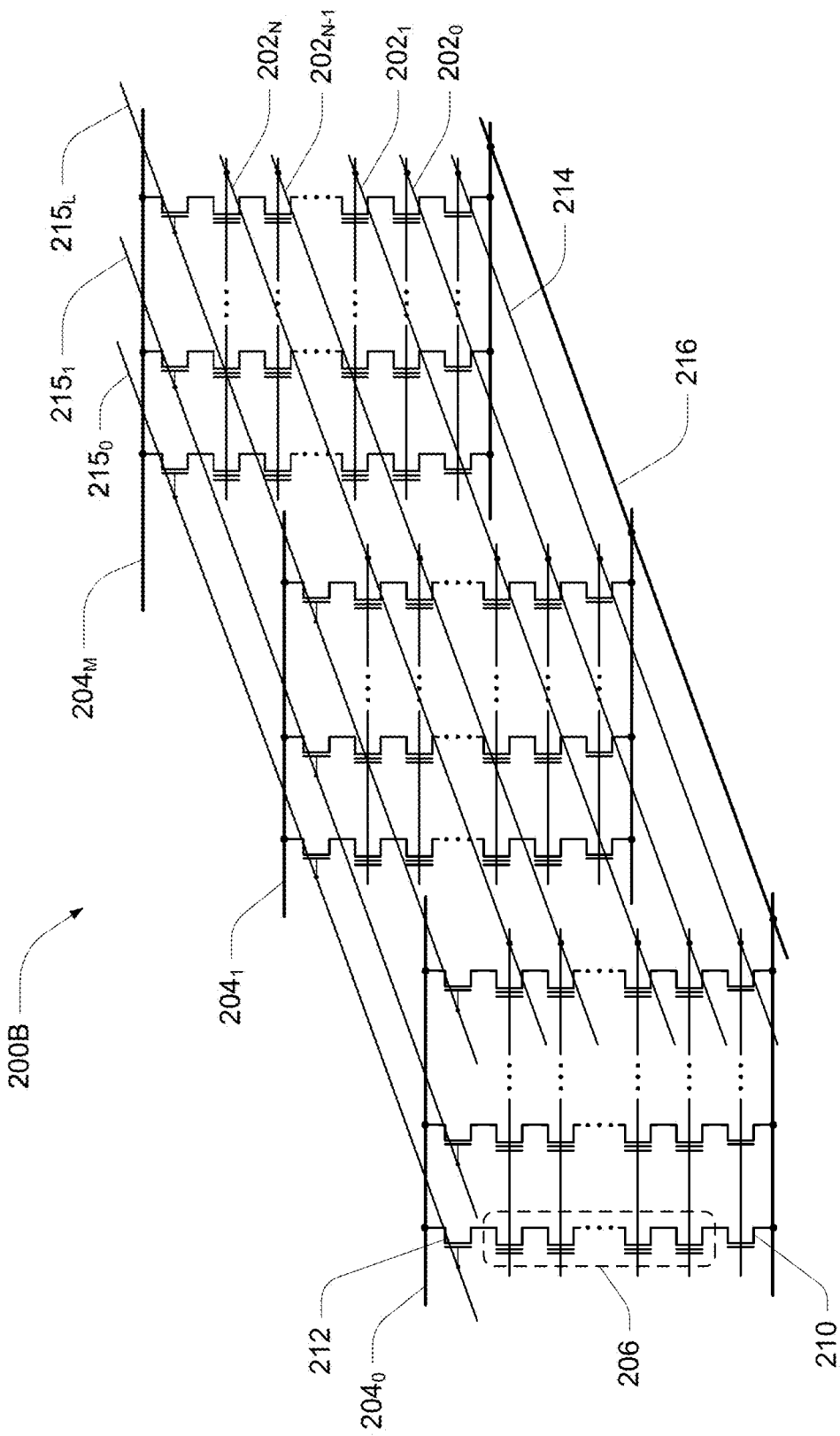

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_L$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 2C:
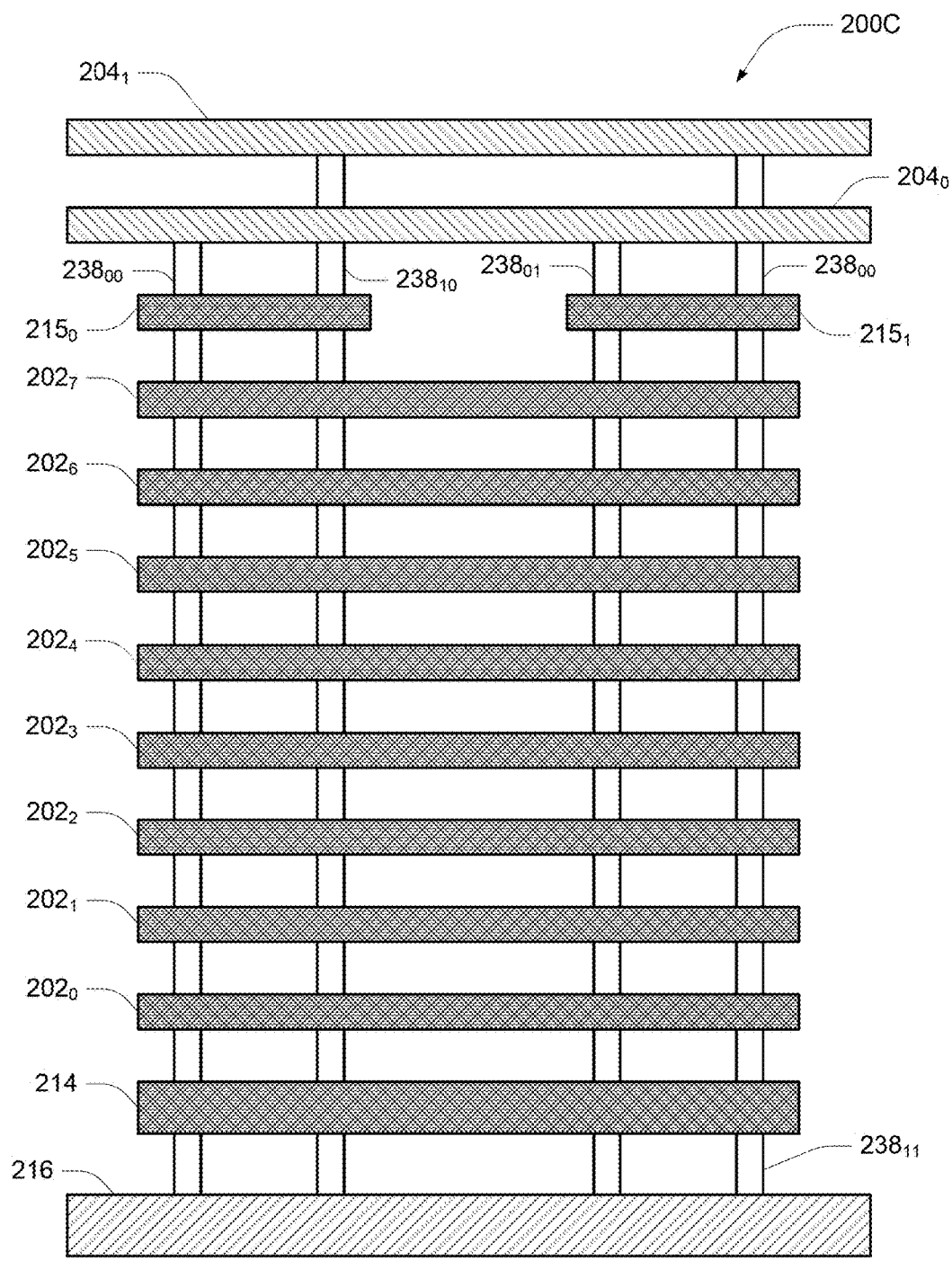
FIG. 2C is a conceptual depiction of a portion of an array of memory cells as could be used in a memory of the type described with reference to FIG. 1.

FIG. 2C is a conceptual depiction of a portion of an array of memory cells 200C as could be used in a memory of the type described with reference to FIG. 1. Data Lines $204_0$ and $204_1$ of FIG. 2C might correspond to data lines $204_0$ and $204_1$ of FIG. 2B. Channel regions (e.g., semiconductor pillars) $238_{00}$ and $238_{01}$ might represent the channel regions of different strings of series-connected memory cells (e.g., NAND strings 206 of FIGS. 2A-2B) selectively connected to the data line $204_0$ in response to select lines $215_0$ and $215_1$, respectively. Similarly, channel regions $238_{10}$ and $238_{11}$ might represent the channel regions of different strings of series-connected memory cells (e.g., NAND strings 206 of FIGS. 2A-2B) selectively connected to the data line $204_1$ in response to select lines $215_0$ and $215_1$, respectively. The access lines $202_0$-$202_N$ depicted in FIG. 2A might be represented in FIG. 2C by the access lines $202_0$-$202_7$, where N might be equal to 7 in this example. While strings of series-connected memory cells typically contain much larger numbers of memory cells, FIG. 2C has been simplified for discussion. A memory cell (not depicted in FIG. 2C) may be formed at each intersection of an access line 202 and a channel region 238, and the memory cells corresponding to a single channel region 238 may collectively form a string of series-connected memory cells (e.g., a NAND string of FIGS. 2A-2B). The structure depicted and described with reference to FIG. 2C will be used to describe various embodiments herein. Additional features might be common in such structures, such as dummy access lines, segmented channel regions with interposed conductive regions, etc. However, such alterations or enhancements to the simplified structure depicted in FIG. 2C are not relevant to embodiments described herein.

Figure 3:
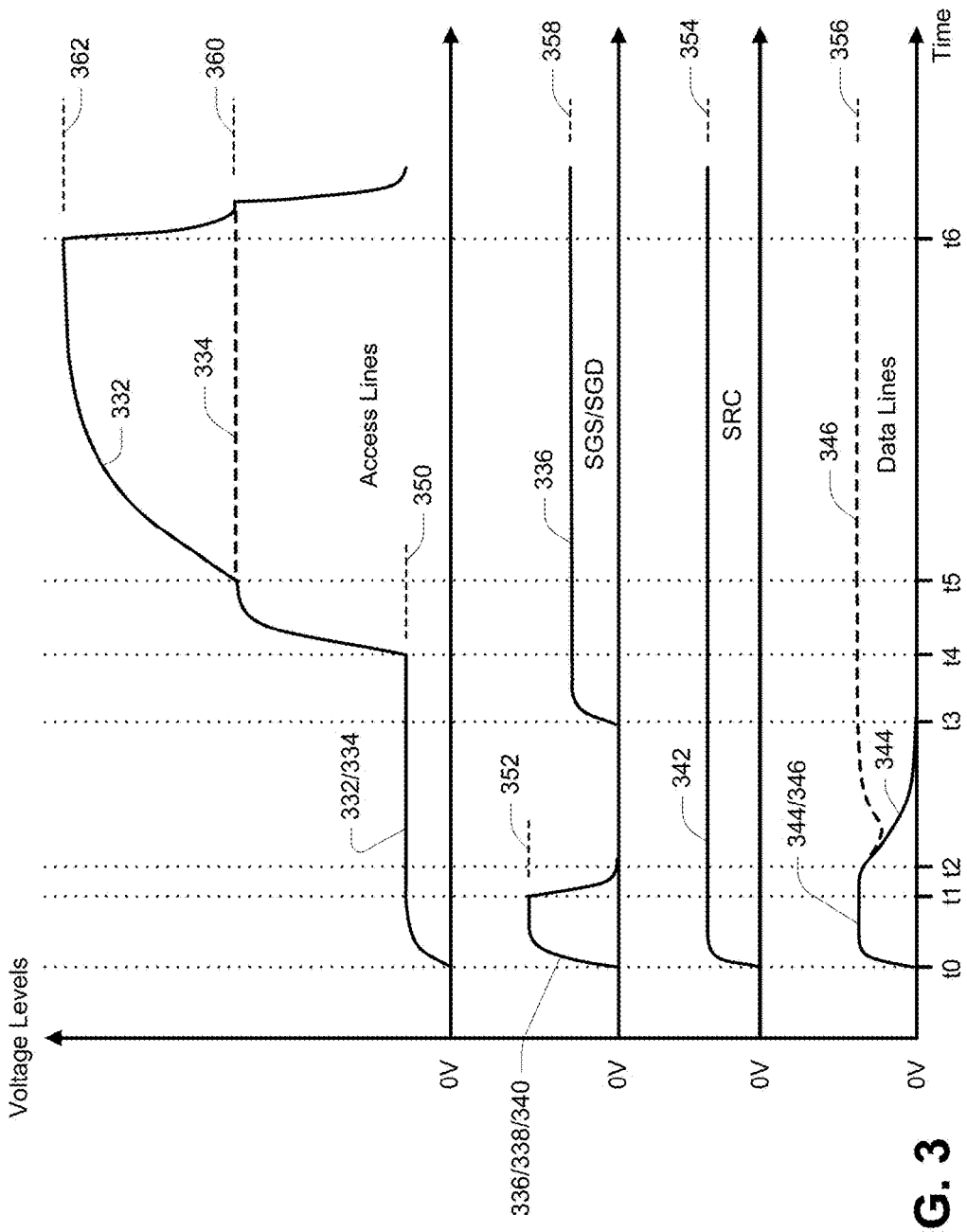
FIG. 3 depicts a waveform for a programming operation of related art.

FIG. 3 depicts waveforms for a programming operation of related art. As is typical in the related art, a programming operation might include a first portion used to precharge or seed the channel regions of memory cells of a block of memory cells to a precharge voltage level, a second portion used to boost the voltage level of the channel regions of strings of series-connected memory cells of the block of memory cells not intended for programming (e.g., to be inhibited) to a voltage level sufficient to inhibit programming of any memory cell of those strings of series-connected memory cells receiving a programming voltage, and a third portion used for programming one or more selected memory cells of other strings of memory cells of the block of memory cells. The first portion typically involves applying a voltage (e.g., Vcc or other supply voltage) to at least those data lines to be inhibited from programming (e.g., unselected data lines) while those data lines are connected to their respective channel regions (e.g., unselected channel regions) through the activation of the drain select gates and all memory cells associated with those channel regions. The second portion typically involves electrically floating those unselected channel regions, and then increasing the access line voltages to a pass voltage (e.g., Vpass) in order to boost the voltage level of the unselected channel regions. The voltage level of the pass voltage might be selected to reach a boosted voltage level of the unselected channel regions at a level sufficient to inhibit programming of any corresponding memory cell receiving a programming voltage in the third portion of the programming operation.

Consider the portion of the array of memory cells 200C of FIG. 2C, where the memory cell formed at the intersection of the access line $202_3$ and the channel region $238_{00}$ is selected for programming, but remaining memory cells are to be inhibited from programming. In this example, the access line $202_3$ would be a selected access line, e.g., an access line selected for programming, while access lines $202_0$-$202_2$ and $202_4$-$202_7$ would be unselected access lines, e.g., access lines unselected for programming. Similarly, in this example, the data line (e.g., bit line) $204_0$ would be a selected data line while the data line (e.g., bit line) $204_1$ would be an unselected, or inhibited, data line. Because the select line $215_0$ may be used to selectively connect the data line $204_0$ to the memory cell selected for programming, it may be referred to as a selected select line even though it also may be used to selectively connect the data line $204_1$ to a memory cell formed at the intersection of the access line $202_3$ and the channel region $238_{10}$.

In FIG. 3, the waveform 332 represents the waveform of voltage levels of the selected access line (e.g., access line $202_3$) during a programming operation while the waveform 334 represents the waveform of voltage levels of an unselected access line (e.g., all or a subset of unselected access lines $202_0$-$202_2$ and $202_4$-$202_7$) during the programming operation.

The waveform 336 represents the waveform of voltage levels of a selected select line (e.g., drain select line SGD or select line $215_0$ of FIG. 2C) during the programming operation, while the waveform 338 represents the waveform of voltage levels of an unselected select line (e.g., drain select line SGD or select line $215_1$ of FIG. 2C)) during the programming operation. The waveform 336 might represent voltage levels applied to select gates 212 through the select line 215 of FIG. 2A (e.g., select line $215_0$ of FIG. 2C). The waveform 338 might represent voltage levels applied to corresponding select gates 212 through other select lines, e.g., select line $215_1$ of FIG. 2C).

The waveform 340 represents the waveform of voltage levels of a select line (e.g., source select line SGS or select line 214 of FIG. 2C). The waveform 340 might represent voltage levels applied to select gates 210 of FIG. 2A. The waveform 342 represents the waveform of a source (e.g., common source or SRC 216).

The waveform 344 represents the waveform of voltage levels of a selected data line (e.g., bit line) during the programming operation while the waveform 346 represents the waveform of voltage levels of an unselected data line (e.g., bit line) during the programming operation. The waveforms 344 and 346 might represent voltage levels applied to the data lines $204_0$ and $204_1$ of FIG. 2C, respectively. In the following description of FIG. 3, reference numerals in parentheses refer to the corresponding waveform for relevant voltage levels.

In the related art programming operation, at time t0, a voltage level 350 might be applied (e.g., biased) to the selected access line (332) and to the unselected access line (334). A voltage level 352 might be applied to the selected (drain) select line (336), to the unselected (drain) select line (338), and to the (source) select line (340). A voltage level 354 might be applied to the source (342). And a voltage level 356 might be applied to the selected data line (344) and to the unselected data line (346). The applied voltage levels might begin from some initial voltage level, e.g., a reference potential. The reference potential might be a supply voltage, e.g., Vss or ground (e.g., 0V).

Typically, the voltage level 350, e.g., a seed voltage level, might be less than the voltage level 356 of the data lines (344/346) As one example, the voltage level 356 applied to the data lines (344/346) might be a supply voltage, e.g., a positive supply voltage or Vcc, that is different than (e.g., higher than) the voltage level of the reference potential. The voltage level 352 applied to the select lines (336/338/340) might be higher than the voltage level 356 in order to activate the corresponding select gates. The voltage level 354 applied to the source (342) might also be higher than the voltage level 350, and might be a same voltage level as the voltage level 356.

At time t1, the voltage level applied to the select lines (336/338/340) might be returned to the reference potential or other voltage level sufficient to deactivate the corresponding select gates. Voltage levels applied to the access lines (332/334), the source (342) and the data lines (344/346) might be maintained at their voltage levels 350, 354 and 356, respectively. The period of time from t0 to t1 might be referred to as a seed time or tSEED. During this period of time, a voltage level of channels of the memory cells might be expected to rise.

At time t2, the voltage level applied to the selected data line (344) might be lowered (e.g., biased) from the voltage level 356. For example, the voltage level applied to the selected data line (344) might be transitioned to the reference potential. The voltage level applied to the unselected data lines (346) might be maintained at the voltage level 356. Although the voltage level applied to the unselected data lines (346) might be maintained at the voltage level 356, a temporary dip in its voltage level might be expected due to capacitive coupling to the selected data line (344). The period of time from t1 to t2 might be referred to as a discharge time or tSGDdisc.

At time t3, the voltage level of the selected (drain) select line (336) might be raised (e.g., biased) to the voltage level 358. The voltage level 358 may be sufficient to activate its corresponding select gate associated with the selected data line, and to deactivate its corresponding select gates associated with an unselected data line. The period of time from t2 to t3 might be referred to as a data line (e.g., bit line) set time or tBLSET. During this period of time, the voltage levels of the data lines (344/346) are allowed to settle to their intended voltage levels.

At time t4, the voltage level of the access lines (332/334) might be raised to some voltage level 360. The voltage level 360 may be sufficient to activate their corresponding memory cells regardless of their data states, e.g., Vpass. Because the channel regions of the strings of series-connected memory cells selectively connected to the unselected data lines are isolated from their respective unselected data lines (and, for example, isolated from the source), the higher voltage level of the access lines (332/334) may tend to further increase (e.g., boost) the voltage level of these channel regions. The channel region of the string of series-connected memory cells selectively connected to the selected data line, being connected to the selected data line, may not experience a change in its voltage level.

At time t5, the voltage level of the selected access line (334) might be raised to some voltage level 362. The voltage level 362 may be sufficient to change (e.g., increase) a threshold voltage of a memory cell coupled to the selected access line of the string of series-connected memory cells selectively connected (e.g., connected) to the selected data line, and may be configured to inhibit a change (e.g., inhibit an increase) in a threshold voltage of any memory cell coupled to the selected access line of a string of series-connected memory cells selectively connected to (e.g., isolated from) an unselected data line.

At time t6, the programming operation might be complete, and the various voltage levels could be discharged. As is typical, a verify operation might follow to determine if any memory cells selected for programming reached their intended target data state (e.g., target threshold voltage). For such memory cells reaching their intended target data state, they might be inhibited from programming for a subsequent programming operation, while other such memory cells not reaching their intended target data state might be selected for programming for a subsequent programming operation.

While the foregoing method of FIG. 3 has been used in the related art, it may be ineffective in vertical memory arrays such as the structure depicted in FIG. 2C. In particular, as the length of the strings of series-connected memory cells increases, e.g., as the strings contain more memory cells, the length of the channel regions may become longer. The resulting resistance of the channel region may limit the effectiveness of the seed operation, and thus limit the voltage level that might be reached during the seed portion. To mitigate such a resistance concern, various embodiments seek to employ gate-induced drain leakage (GIDL) during seeding.

Figure 4:
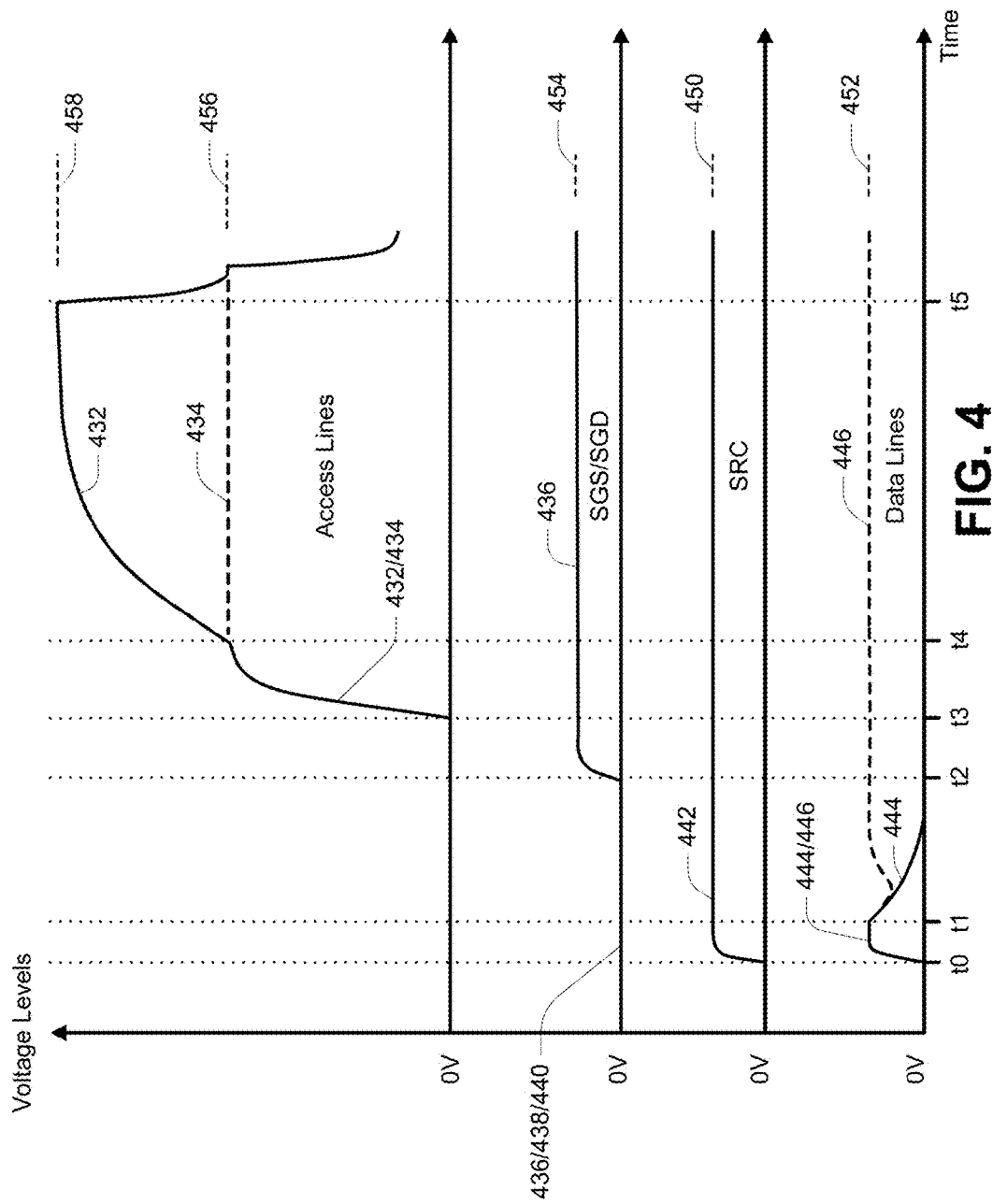
FIG. 4 depicts a waveform for a programming operation in accordance with an embodiment.

FIG. 4 depicts a waveform for a programming operation in accordance with an embodiment. The discussion of FIG. 4 will make the same references to the structure of FIG. 2C as was used in the discussion of FIG. 3.

In FIG. 4, the waveform 432 represents the waveform of voltage levels of the selected access line (e.g., access line $202_3$) during a programming operation while the waveform 434 represents the waveform of voltage levels of an unselected access line (e.g., all or a subset of unselected access lines $202_0$-$202_2$ and $202_4$-$202_7$) during the programming operation.

The waveform 436 represents the waveform of voltage levels of a selected select line (e.g., drain select line SGD or select line $215_0$ of FIG. 2C) during the programming operation, while the waveform 438 represents the waveform of voltage levels of an unselected select line (e.g., drain select line SGD or select line $215_1$ of FIG. 2C)) during the programming operation. The waveform 436 might represent voltage levels applied to select gates 212 through the select line 215 of FIG. 2A (e.g., select line $215_0$ of FIG. 2C). The waveform 438 might represent voltage levels applied to corresponding select gates 212 through other select lines, e.g., select line $215_1$ of FIG. 2C). The waveforms 436, 438 and 440 might also represent waveforms of voltage levels applied to the corresponding select gates of the various select lines.

The waveform 440 represents the waveform of voltage levels of a select line (e.g., source select line SGS or select line 214 of FIG. 2C). The waveform 440 might represent voltage levels applied to select gates 210 of FIG. 2A. The waveform 442 represents the waveform of a source (e.g., common source or SRC 216).

The waveform 444 represents the waveform of voltage levels of a selected data line (e.g., bit line) during the programming operation while the waveform 446 represents the waveform of voltage levels of an unselected data line (e.g., bit line) during the programming operation. The waveforms 444 and 446 might represent voltage levels applied to the data lines $204_0$ and $204_1$ of FIG. 2C, respectively. In the following description of FIG. 4, reference numerals in parentheses refer to the corresponding waveform for relevant voltage levels.

Unlike the related art method of FIG. 3, select gates (e.g., select gates 210 and 212 of FIG. 2A) might remain deactivated (e.g., at a reference potential) when voltage levels are raised on the data lines, and the voltage levels of the access lines (e.g., access lines 202) might remain at a reference potential. For example, at time t0, a voltage level 450 might be applied to the source (442), and a voltage level 452 might be applied to the selected data line (444) and to the unselected data line (446). The applied voltage levels might begin from some initial voltage level, e.g., a reference potential. The reference potential might be a supply voltage, e.g., Vss or ground (e.g., 0V).

As one example, the voltage level 452 applied to the data lines (444/446) might be a supply voltage, e.g., Vcc, that is different than (e.g., higher than) the voltage level of the reference potential. The voltage level 450 applied to the source (442) might also be higher than the reference potential, and might be a same voltage level as the voltage level 452. The voltage level 450 and/or the voltage level 452 might be some voltage level sufficient to induce GIDL across the select gates 210 and/or 212, respectively. It is not uncommon for a channel region (e.g., channel region 338 of FIG. 2C) to have a negative voltage level following a read operation, such as a verify operation. This negative voltage level might be on the order of a few volts. The resulting reverse bias across the outer junction of the select gates may be used to generate GIDL current. The negative voltage level of the channel regions may offer lower resistance to hole transport, allowing the GIDL current to facilitate neutralizing the voltage level of the channel regions.

At time t1, the voltage level applied to the selected data line (444) might be lowered (e.g., biased) from the voltage level 452. For example, the voltage level applied to the selected data line (444) might be transitioned to the reference potential. The voltage level applied to the unselected data lines (446) might be maintained at the voltage level 452. Although the voltage level applied to the unselected data lines (446) might be maintained at the voltage level 452, a temporary dip in its voltage level might be expected due to capacitive coupling to the selected data line (444). The period of time from t0 to t1 might be referred to as a seed time or tSEED. During this period of time, a voltage level of channels of the memory cells might be expected to rise due to the GIDL current, and may reach a neutral (e.g., 0V) or positive voltage level. Note there is no corresponding discharge time (e.g., tSGDdisc) as found in the process of FIG. 3, which can result in time savings over the related art.

At time t2, the voltage level of the selected (drain) select line (436) might be raised (e.g., biased) to the voltage level 454. The voltage level 454 may be sufficient to activate its corresponding select gate associated with the selected data line, and to deactivate its corresponding select gates associated with an unselected data line. The period of time from t1 to t2 might be referred to as a data line (e.g., bit line) set time or tBLSET. During this period of time, the voltage levels of the data lines (444/446) are allowed to settle to their intended voltage levels.

At time t3, the voltage level of the access lines (432/444) might be raised to some voltage level 456. The voltage level 456 may be sufficient to activate their corresponding memory cells regardless of their data states, e.g., Vpass. Because the channel regions of the strings of series-connected memory cells selectively connected to the unselected data lines are isolated from their respective unselected data lines (and, for example, isolated from the source), the higher voltage level of the access lines (432/444) may tend to further increase (e.g., boost) the voltage level of these channel regions. The channel region of the string of series-connected memory cells selectively connected to the selected data line, being connected to the selected data line, may not experience a change in its voltage level. Note that where the voltage level 456 and the voltage level 360 are a same voltage level, and where the voltage level of the access lines (432/434) is raised from a reference potential to the voltage level 456, a larger boost of the voltage level of the channel region might be achieved over the process of the related art of FIG. 3 where the voltage level of the access lines (332/334) is raised from the voltage level 350 to the voltage level 360. That is, a greater voltage different for boosting might be achieved using a same final voltage for the unselected access lines.

At time t4, the voltage level of the selected access line (444) might be raised to some voltage level 458. The voltage level 458 may be sufficient to change (e.g., increase) a threshold voltage of a memory cell coupled to the selected access line of the string of series-connected memory cells selectively connected (e.g., connected) to the selected data line, and may be configured to inhibit a change (e.g., inhibit an increase) in a threshold voltage of any memory cell coupled to the selected access line of a string of series-connected memory cells selectively connected to (e.g., isolated from) an unselected data line.

At time t5, the programming operation might be complete, and the various voltage levels could be discharged. As is typical, a verify operation might follow to determine if any memory cells selected for programming reached their intended target data state (e.g., target threshold voltage). For such memory cells reaching their intended target data state, they might be inhibited from programming for a subsequent programming operation, while other such memory cells not reaching their intended target data state might be selected for programming for a subsequent programming operation.

Figure 5:
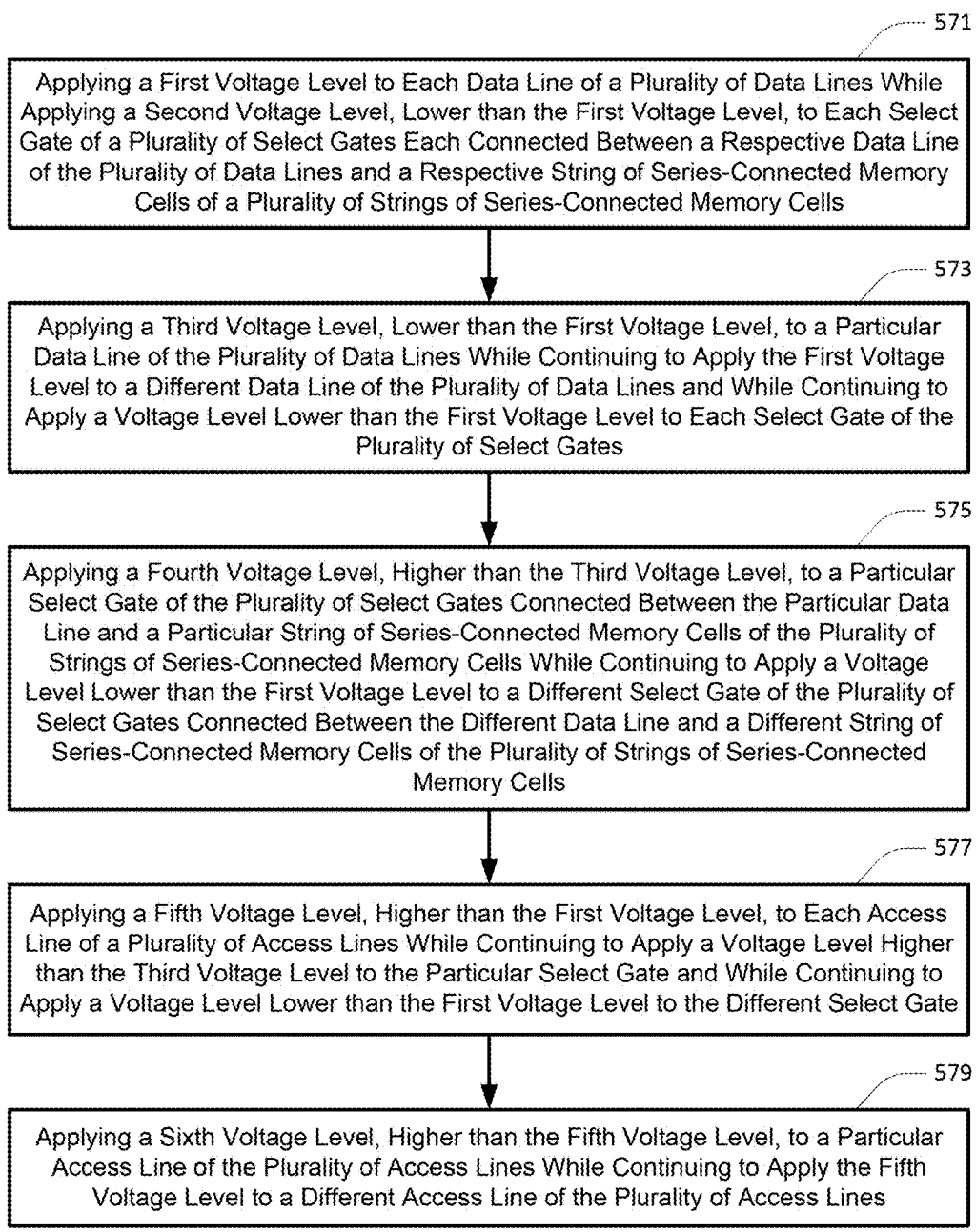
FIG. 5 is a flowchart of a method of operating a memory according to an embodiment.

FIG. 5 is a flowchart of a method of operating a memory according to an embodiment. At 571, a first voltage level might be applied to each data line of a plurality of data lines while a second voltage level, lower than the first voltage level, might be applied to each select gate of a plurality of select gates. The select gates of the plurality of select gates may each be connected between a respective data line of the plurality of data lines and a respective string of series-connected memory cells of a plurality of strings of series-connected memory cells. Concurrently, the first voltage level might be applied to a source and the second voltage level might be applied to each select gate of a different plurality of select gates. The select gates of the different plurality of select gates may each be connected between the source and a respective string of series-connected memory cells of a plurality of strings of series-connected memory cells. With reference to the example of FIG. 4, the first voltage level might correspond to the voltage level 452 and the second voltage level might correspond to a voltage level lower than the voltage level 452 (e.g., the reference potential) with reference to the discussion of the period of time between t0 and t1.

At 573, a third voltage level, lower than the first voltage level, might be applied to a particular (e.g., selected) data line of the plurality of data lines while continuing to apply the first voltage level to a different (e.g., unselected) data line of the plurality of data lines, and while continuing to apply a voltage level lower than the first voltage level (e.g., the second voltage level) to each gate of the plurality of select gates. Optionally, a voltage level lower than the first voltage level (e.g., the second voltage level) might continue to be applied to each select gate of the different plurality of select gates. With reference to the example of FIG. 4, the third voltage level might correspond to a voltage level lower than the voltage level 452 (e.g., the reference potential) with reference to the discussion of the period of time between t1 and t2.

At 575, a fourth voltage level, higher than the third voltage level, might be applied to a particular (e.g., selected) select gate of the plurality of select gates connected between the particular data line and a particular string of series-connected memory cells (e.g., containing the memory cell selected for programming) of the plurality of strings of series-connected memory cells while continuing to apply a voltage level lower than the first voltage level (e.g., the second voltage level) to a different (e.g., unselected) select gate of the plurality of select gates connected between the different data line and a different string of series-connected memory cells (e.g., not containing a memory cell selected for programming) of the plurality of strings of series-connected memory cells. Optionally, a voltage level lower than the first voltage level (e.g., the second voltage level) might continue to be applied to select gates of the different plurality of select gates. With reference to the example of FIG. 4, the fourth voltage level might correspond to the voltage level 454 with reference to the discussion of the period of time between t2 and t3.

At 577, a fifth voltage level, higher than the first voltage level, might be applied to each access line of a plurality of access lines while continuing to apply a voltage level higher than the third voltage level (e.g., the fourth voltage level) to the particular select gate and while continuing to apply a voltage level lower than the first voltage level (e.g., the second voltage level) to the different select gate. Optionally, a voltage level lower than the first voltage level (e.g., the second voltage level) might continue to be applied to select gates of the different plurality of select gates. With reference to the example of FIG. 4, the fifth voltage level might correspond to the voltage level 456 with reference to the discussion of the period of time between t3 and t4.

At 579, a sixth voltage level, higher than the fifth voltage level, might be applied to a particular (e.g., selected) access line of the plurality of access lines while continuing to apply the fifth voltage level to a different (e.g., unselected) access line of the plurality of access lines. With reference to the example of FIG. 4, the sixth voltage level might correspond to the voltage level 458 with reference to the discussion of the period of time between t4 and t5.

Figure 6:
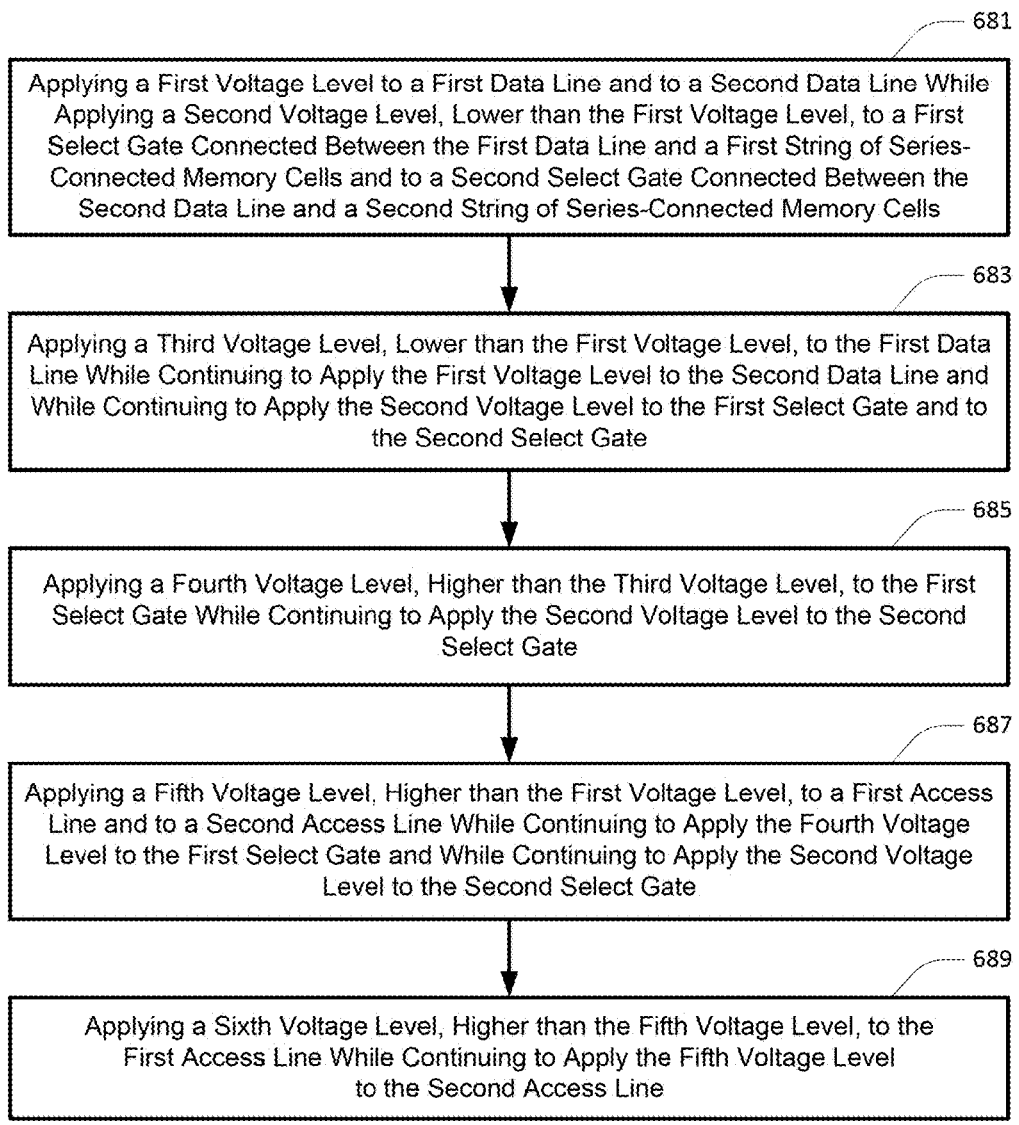
FIG. 6 is a flowchart of a method of operating a memory according to another embodiment.

FIG. 6 is a flowchart of a method of operating a memory according to another embodiment. At 681, a first voltage level might be applied to a first (e.g., selected) data line and a second (e.g., unselected) data line while a second voltage level, lower than the first voltage level, might be applied to a first (e.g., selected) select gate connected between the first data line and a first string of series-connected memory cells and to a second (e.g., unselected) select gate connected between the second data line and a second string of series-connected memory cells. Concurrently, the first voltage level might be applied to a source and the second voltage level might be applied to a third select gate connected between the source and the first string of series-connected memory cells and to a fourth select gate connected between the source and the second string of series-connected memory cells. The first string of series-connected memory cells might contain a memory cell selected for programming during a programming operation while the second string of series-connected memory cells might not contain a memory cell selected for programming during the programming operation. With reference to the example of FIG. 4, the first voltage level might correspond to the voltage level 452 and the second voltage level might correspond to a voltage level lower than the voltage level 452 (e.g., the reference potential) with reference to the discussion of the period of time between t0 and t1.

At 683, a third voltage level, lower than the first voltage level, might be applied to the first data line while continuing to apply the first voltage level to the second data line, and while continuing to apply the second voltage level to the first select gate and to the second select gate. Optionally, the second voltage level might continue to be applied to the third select gate and to the fourth select gate. With reference to the example of FIG. 4, the third voltage level might correspond to a voltage level lower than the voltage level 452 (e.g., the reference potential) with reference to the discussion of the period of time between t1 and t2.

At 685, a fourth voltage level, higher than the third voltage level, might be applied to the first select gate while continuing to apply the second voltage level to the second select gate. Optionally, the second voltage level might continue to be applied to the third select gate and to the fourth select gate. With reference to the example of FIG. 4, the fourth voltage level might correspond to the voltage level 454 with reference to the discussion of the period of time between t2 and t3.

At 687, a fifth voltage level, higher than the first voltage level, might be applied to a first (e.g., selected) access line and to a second (e.g., unselected) access line while continuing to apply the fourth voltage level to the first select gate and while continuing to apply the second voltage level to the second select gate. Optionally, the second voltage level might continue to be applied to the third select gate and to the fourth select gate. With reference to the example of FIG. 4, the fifth voltage level might correspond to the voltage level 456 with reference to the discussion of the period of time between t3 and t4.

At 689, a sixth voltage level, higher than the fifth voltage level, might be applied to the first access line while continuing to apply the fifth voltage level to the second access line. With reference to the example of FIG. 4, the sixth voltage level might correspond to the voltage level 458 with reference to the discussion of the period of time between t4 and t5.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating a memory, comprising:
    applying a first voltage level to a first data line and to a second data line while applying a second voltage level, lower than the first voltage level, to a first select gate connected between the first data line and a first string of series-connected memory cells and to a second select gate connected between the second data line and a second string of series-connected memory cells;
    applying a third voltage level, lower than the first voltage level, to the first data line while continuing to apply the first voltage level to the second data line and while continuing to apply a voltage level lower than the first voltage level to the first select gate and to the second select gate;
    applying a fourth voltage level, higher than the third voltage level, to the first select gate while continuing to apply a voltage level lower than the first voltage level to the second select gate;
    applying a fifth voltage level, higher than the first voltage level, to a first access line and to a second access line while continuing to apply the fourth voltage level to the first select gate and while continuing to apply a voltage level lower than the first voltage level to the second select gate, wherein the first access line and the second access line are each coupled to a respective memory cell of the first string of series-connected memory cells and to a respective memory cell of the second string of series-connected memory cells; and applying a sixth voltage level, higher than the fifth voltage level, to the first access line while continuing to apply the fifth voltage level to the second access line.

2. The method of claim 1, wherein the first access line is coupled a first memory cell of the first string of series-connected memory cells and coupled to a second memory cell of the second string of series-connected memory cells, and wherein applying the sixth voltage level to the first access line comprises applying a voltage level configured to increase a threshold voltage of the first memory cell and configured to inhibit an increase in a threshold voltage of the second memory cell.

3. The method of claim 1, wherein applying the third voltage level to the first data line while continuing to apply a voltage level lower than the first voltage level to the first select gate comprises applying the third voltage level to the first data line while continuing to apply the second voltage level to the first select gate.

4. The method of claim 3, wherein applying the fourth voltage level to the first select gate while continuing to apply a voltage level lower than the first voltage level to the second select gate comprises applying the fourth voltage level to the first select gate while continuing to apply the second voltage level to the second select gate.

5. The method of claim 4, wherein continuing to apply the fourth voltage level to the first select gate while continuing to apply a voltage level lower than the first voltage level to the second select gate comprises continuing to apply the fourth voltage level to the first select gate while continuing to apply the second voltage level to the second select gate.

6. The method of claim 1, wherein applying the first voltage level comprises applying a positive supply voltage.

7. The method of claim 1, wherein applying the positive supply voltage comprises applying Vcc.

8. The method of claim 6, wherein applying the second voltage level comprises applying a reference potential.

9. The method of claim 8, wherein applying the reference potential comprises applying a ground.

10. A method of operating a memory, comprising:
applying a first voltage level to a first data line and to a second data line while applying a second voltage level, lower than the first voltage level, to a first select gate connected between the first data line and a first string of series-connected memory cells and to a second select gate connected between the second data line and a second string of series-connected memory cells;
applying a third voltage level, lower than the first voltage level, to the first data line while continuing to apply the first voltage level to the second data line and while continuing to apply the second voltage level to the first select gate and to the second select gate;
applying a fourth voltage level, higher than the third voltage level, to the first select gate while continuing to apply the second voltage level to the second select gate;
applying a fifth voltage level, higher than the first voltage level, to a first access line and to a second access line while continuing to apply the fourth voltage level to the first select gate and while continuing to apply the second voltage level to the second select gate; and
applying a sixth voltage level, higher than the fifth voltage level, to the first access line while continuing to apply the fifth voltage level to the second access line.

11. The method of claim 10, wherein applying the second voltage level and applying the third voltage level comprises applying the second voltage level having a same voltage level as the third voltage level.

12. The method of claim 10, wherein applying the fourth voltage level to the first select gate comprises applying a voltage level configured to activate the first select gate.

13. The method of claim 12, wherein applying the second voltage level to the second select gate comprises applying a voltage level configured to deactivate the second select gate.

14. The method of claim 10, wherein applying the fifth voltage level to the first access line and to the second access line comprises applying a voltage level configured to increase a voltage level of a channel region of the second string of series-connected memory cells to a value configured to inhibit programming of a first memory cell of the second string of series-connected memory cells coupled to the first access line and to inhibit programming of a second memory cell of the second string of series-connected memory cells coupled to the second access line.

15. The method of claim 14, further comprising applying the fifth voltage level to each remaining access line coupled to a respective memory cell of the second string of series-connected memory cells while applying the fifth voltage level to the first access line and to the second access line.

16. The method of claim 15, wherein applying the fifth voltage level comprises applying a voltage level configured to increase the voltage level of the channel region of the second string of series-connected memory cells to a value configured to inhibit programming of each memory cell of the second string of series-connected memory cells.

17. A method of operating a memory, comprising:
applying a first voltage level to each data line of a plurality of data lines while applying a second voltage level, lower than the first voltage level, to each select gate of a plurality of select gates each connected between a respective data line of the plurality of data lines and a respective string of series-connected memory cells of a plurality of strings of series-connected memory cells;
applying a third voltage level, lower than the first voltage level, to a particular data line of the plurality of data lines while continuing to apply the first voltage level to a different data line of the plurality of data lines and while continuing to apply a voltage level lower than the first voltage level to each select gate of the plurality of select gates;
applying a fourth voltage level, higher than the third voltage level, to a particular select gate of the plurality of select gates connected between the particular data line and a particular string of series-connected memory cells of the plurality of strings of series-connected memory cells while continuing to apply a voltage level lower than the first voltage level to a different select gate of the plurality of select gates connected between the different data line and a different string of series-connected memory cells of the plurality of strings of series-connected memory cells;
applying a fifth voltage level, higher than the first voltage level, to each access line of a plurality of access lines while continuing to apply a voltage level higher than the third voltage level to the particular select gate and while continuing to apply a voltage level lower than the first voltage level to the different select gate; and applying a sixth voltage level, higher than the fifth voltage level, to a particular access line of the plurality of access lines while continuing to apply the fifth voltage level to a different access line of the plurality of access lines.

18. The method of claim 17, wherein applying the third voltage level to the particular data line while continuing to apply the first voltage level to the different data line comprises applying the third voltage level to the particular data line while continuing to apply the first voltage level to each data line of the plurality of data lines other than the particular data line.

19. The method of claim 17, wherein applying the fourth voltage level to the particular select gate while continuing to apply a voltage level lower than the first voltage level to the different select gate comprises applying the fourth voltage level to the particular select gate while continuing to apply a voltage level lower than the first voltage level to each select gate of the plurality of select gates other than the particular select gate.

20. The method of claim 17, wherein applying the first voltage level to each data line of the plurality of data lines while applying the second voltage level to each select gate of the plurality of select gates comprises applying a voltage level to each data line of the plurality of data lines configured to induce gate-induced drain leakage (GIDL) current from each data line of the plurality of data lines through a respective select gate of the plurality of select gates.

* * * * *